US009857612B2

(12) United States Patent
Wu

(10) Patent No.: US 9,857,612 B2
(45) Date of Patent: Jan. 2, 2018

(54) METHOD FOR DETERMINING LOCATION OF SHORT-CIRCUIT POINT IN RASTER DEVICE

(71) Applicant: BOE TECHNOLOGY GROUP CO., LTD., Beijing (CN)

(72) Inventor: Yanbing Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/777,665

(22) PCT Filed: Dec. 4, 2014

(86) PCT No.: PCT/CN2014/093067
§ 371 (c)(1),
(2) Date: Sep. 16, 2015

(87) PCT Pub. No.: WO2016/033892
PCT Pub. Date: Mar. 10, 2016

(65) Prior Publication Data
US 2016/0259188 A1    Sep. 8, 2016

(30) Foreign Application Priority Data
Sep. 4, 2014 (CN) .......................... 2014 1 0449167

(51) Int. Cl.
G02F 1/13        (2006.01)
G01R 31/02     (2006.01)
G02F 1/1343   (2006.01)

(52) U.S. Cl.
CPC ........... *G02F 1/1309* (2013.01); *G01R 31/02* (2013.01); *G01R 31/025* (2013.01); *G02F 1/134363* (2013.01); *G02F 2203/69* (2013.01)

(58) Field of Classification Search
CPC .... G02F 1/1309; G01R 31/025; G09G 3/006; G09G 3/3648; G09G 2330/12
(Continued)

(56) References Cited

U.S. PATENT DOCUMENTS 7,663,396 B2 *   2/2010   Kawata ................. G09G 3/006
                                                                             257/72
2001/0026259 A1 * 10/2001   McKnight ............ G09G 3/2011
                                                                             345/95

(Continued)

FOREIGN PATENT DOCUMENTS

CN          1450353 A        10/2003
CN          103487955 A      1/2014

(Continued)

OTHER PUBLICATIONS

Search Report and Written Opinion dated Jun. 29, 2015 from Chinese Patent Office.
Chinese Office Action dated Oct. 25, 2016.

*Primary Examiner* — Jermele M Hollington
*Assistant Examiner* — Christopher McAndrew
(74) *Attorney, Agent, or Firm* — Dilworth & Barrese, LLP.; Michael J. Musella, Esq.

(57) ABSTRACT

A method for determining location of a short-circuit point in a raster device comprises: applying a first DC voltage signal to a common electrode layer in the raster device; applying a second DC voltage signal to only first transparent electrodes in the raster device, or a second DC voltage signal to only second transparent electrodes in the raster device, or a second DC voltage signal to both the first transparent electrodes and the second transparent electrodes in the raster device, an absolute value of a difference between a voltage value of the first DC voltage signal and a voltage value of the second DC voltage signal being not lower than a liquid crystal deflection threshold voltage value (501); acquiring (Continued)

2D display state 3D display state grayscale values of corresponding display areas in the raster device and determining the location of the short-circuit point according to the acquired grayscale values (502). The method provides a solution for determining the location of the short-circuit point which is in contact with the first transparent electrode and the second transparent electrode simultaneously.

20 Claims, 5 Drawing Sheets

(58) Field of Classification Search
    USPC .................................................. 324/760.01
    See application file for complete search history.

(56) References Cited

U.S. PATENT DOCUMENTS

| 2002/0101433 | A1* | 8/2002 | McKnight | ............ | G09G 3/2011 |
|---|---|---|---|---|---|
| | | | | | 345/589 |
| 2005/0258859 | A1* | 11/2005 | So | ........................ | G09G 3/3216 |
| | | | | | 324/760.01 |
| 2008/0012815 | A1* | 1/2008 | Kawata | .................. | G09G 3/006 |
| | | | | | 345/98 |
| 2009/0273556 | A1* | 11/2009 | Shimoshikiryoh | .. | G09G 3/3611 |
| | | | | | 345/99 |
| 2010/0056008 | A1* | 3/2010 | Li | ......................... | G02F 1/1309 |
| | | | | | 445/3 |
| 2013/0082990 | A1* | 4/2013 | Her | .......................... | G09G 5/00 |
| | | | | | 345/206 |
| 2013/0135365 | A1* | 5/2013 | Ito | ............................ | G09G 3/22 |
| | | | | | 345/690 |

FOREIGN PATENT DOCUMENTS

| CN | 103487960 A | 1/2014 |
|---|---|---|
| JP | 02230188 A | 9/1990 |
| JP | 03156492 A | 7/1991 |
| JP | 2000338512 A | 12/2000 |
| JP | 2007278943 A | 10/2007 |

* cited by examiner bad wire

(12) United States Patent
US 9,857,612 B2

METHOD FOR DETERMINING LOCATION OF SHORT-CIRCUIT POINT IN RASTER DEVICE

TECHNICAL FIELD

The present disclosure relates to a method for determining location of a short-circuit point in a raster device.

BACKGROUND

An active barrier device is a typical raster device which can achieve switching between a 2D display state and a 3D display state.

At present, a structure of the active barrier generally includes an upper substrate and a lower substrate oppositely disposed to each other, a liquid crystal layer between the upper substrate and the lower substrate, a first polarizer at a side of the upper substrate facing away from the liquid crystal layer, a second polarizer at a side of the lower substrate facing away from the liquid crystal layer, a common electrode layer at a side of the upper substrate facing the liquid crystal layer, and first transparent electrodes and second transparent electrodes at a side of the lower substrate facing the liquid crystal layer. The first transparent electrodes and the second transparent electrodes are arranged crosswise in a same layer, and a polarization direction of the first polarizer and a polarization direction of the second polarizer are perpendicular to each other or are parallel to each other.

Currently, in a typical active barrier device, since luminance variation in a gap area between the first transparent electrode and the second transparent electrode cannot be controlled, the gap area between the first transparent electrode and the second transparent electrode is manufactured to be relatively narrow, such that a short-circuit point which is in contact with the first transparent electrode and the second transparent electrode simultaneously may be generated easily in the gap area due to reasons such as incomplete etching in the gap area or conductive impurity falling into the gap area. Due to existence of the short-circuit point, when the active barrier device is controlled to present the 3D display state, the display luminance of the second transparent electrode which is in contact with the short-circuit point and should display a bright state will present a gradual change state, and thus the display effect is affected seriously.

In order to improve the display effect of the active barrier device, it is required to determine location of the short-circuit point which is in contact with the first transparent electrode and the second transparent electrode simultaneously so as to remove the short-circuit point. However, there is not a solution for determining the location of the short-circuit point which is in contact with the first transparent electrode and the second transparent electrode simultaneously.

SUMMARY

In at least one embodiment of the present disclosure, there is provided a method for determining location of a short-circuit point in a raster device, so as to provide a solution for determining the location of the short-circuit point which is in contact with the first transparent electrode and the second transparent electrode simultaneously.

According to a first aspect, there is provided a method for determining location of a short-circuit point in a raster device in at least one embodiment of the present disclosure. The method comprises:

applying a first DC voltage signal to a common electrode layer in the raster device;

applying a second DC voltage signal to only first transparent electrodes in the raster device, or applying a second DC voltage signal to only second transparent electrodes in the raster device, or applying a second DC voltage signal to both the first transparent electrodes and the second transparent electrodes in the raster device, an absolute value of a difference between a voltage value of the first DC voltage signal and a voltage value of the second DC voltage signal being not lower than a liquid crystal deflection threshold voltage value; and acquiring grayscale values of corresponding display areas of the raster device and determining the location of the short-circuit point according to the acquired grayscale values.

Optionally, a difference between the absolute value of the difference between the voltage value of the first DC voltage signal and the voltage value of the second DC voltage signal and the liquid crystal deflection threshold voltage value is lower than a set threshold, such that the liquid crystal in the areas not covered by the short-circuit point in the gap area between the first transparent electrode and the second transparent electrode in the raster device does not deflect.

Optionally, the absolute value of the difference between the voltage value of the first DC voltage signal and the voltage value of the second DC voltage signal is not lower than the liquid crystal deflection saturation voltage value.

Optionally, the voltage value of the first DC voltage signal is equal to 0V.

Optionally, said determining the location of the short-circuit point according to the acquired grayscale values comprises:

comparing the acquired grayscale values and a grayscale value of a standard display area and taking a coordinate location which has a different grayscale value as the location of the short-circuit point, wherein the grayscale value of the standard display area is a grayscale value of the corresponding display area when there is no short-circuit point in the raster device.

According to a second aspect, there is provided a method for determining location of a short-circuit point in a raster device in at least one embodiment of the present disclosure. The method comprises:

applying a first DC voltage signal to only first transparent electrodes in the raster device, or applying a first DC voltage signal to only second transparent electrodes in the raster device, or applying a first DC voltage signal to both the first transparent electrodes and the second transparent electrodes in the raster device, a voltage value of the first DC voltage signal being not lower than a liquid crystal deflection threshold voltage value; and acquiring grayscale values of corresponding display areas in the raster device and determining the location of the short-circuit point according to the acquired grayscale values.

Optionally, before acquiring the grayscale values of the corresponding display area in the raster device, the method further comprises:

applying a second DC voltage signal to a common electrode layer in the raster device, wherein an absolute value of a difference between a voltage value of the second DC voltage signal and the voltage value of the first DC voltage signal is not lower than the liquid crystal deflection threshold voltage value.

Optionally, a difference between the absolute value of the difference between the voltage value of the second DC voltage signal and the voltage value of the first DC voltage signal and the liquid crystal deflection threshold voltage value is lower than a set threshold, such that the liquid crystal in the areas not covered by the short-circuit point in the gap area between the first transparent electrode and the second transparent electrode in the raster device does not deflect.

Optionally, the absolute value of the difference between the voltage value of the second DC voltage signal and the voltage value of the first DC voltage signal is not lower than a liquid crystal deflection saturation voltage value.

Optionally, the voltage value of the second DC voltage signal is equal to 0V.

Optionally, said determining the location of the short-circuit point according to the acquired grayscale values comprises:

comparing the acquired grayscale values and a grayscale value of a standard display area and taking a coordinate location which has a different grayscale value as the location of the short-circuit point, wherein the grayscale value of the standard display area is a grayscale value of the corresponding display area when there is no short-circuit point in the raster device.

The advantageous effects achieved by the embodiments of the present disclosure comprise the following.

In a first powering manner, a first DC voltage signal is applied to the common electrode layer; and a second DC voltage signal is applied to only the first transparent electrodes, or a second DC voltage signal is applied to only the second transparent electrodes, or a second DC voltage signal is applied to both the first transparent electrodes and the second transparent electrodes, wherein an absolute value of a difference between a voltage value of the first DC voltage signal and a voltage value of the second DC voltage signal is not lower than the liquid crystal deflection threshold voltage value;

in a second powering manner, a first DC voltage signal is applied to only the first transparent electrodes in the raster device, or a first DC voltage signal is applied to only the second transparent electrodes in the raster device, or a first DC voltage signal is applied to both the first transparent electrodes and the second transparent electrodes in the raster device, wherein a voltage value of the first DC voltage signal is not lower than the liquid crystal deflection threshold voltage value.

In the embodiments of the present disclosure, after adopting any one of the above powering manners, it is possible that the display grayscale of the area where the short-circuit point in the gap area between the first transparent electrode and the second transparent electrode is located is different from the display grayscale of other gap areas.

Therefore, after the grayscale values of the corresponding display areas in the raster device are acquired, the location of the short-circuit point can be determined according to the acquired grayscale values.

DETAILED DESCRIPTION

Figure 1A:
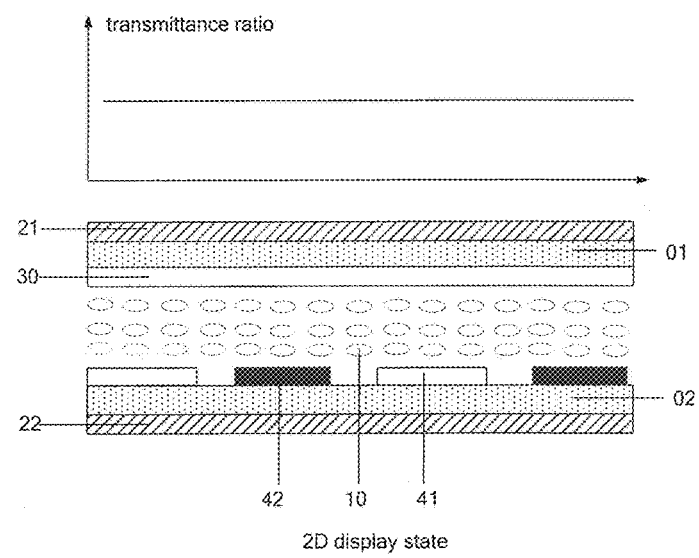
FIG. 1a and FIG. 1b are schematic diagrams of a structure of a typical active barrier device with a common electrode layer.
Figure 1B:
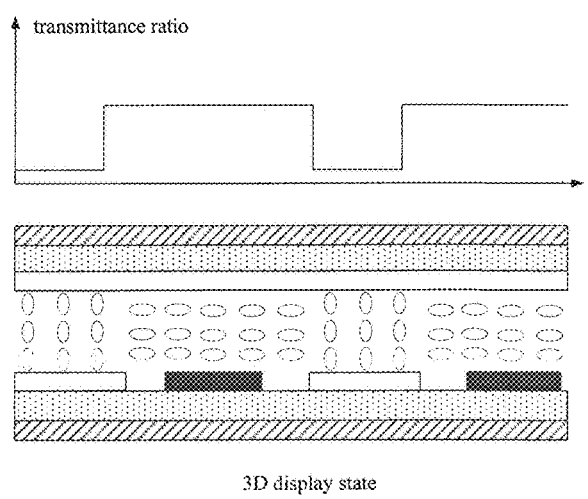

FIG. 1a and FIG. 1b are schematic diagrams of a structure of a typical active barrier device with a common electrode layer. At present, the structure of the active barrier device is generally as shown in FIG. 1a, and comprises an upper substrate 01 and a lower substrate 02 oppositely disposed to each other, a liquid crystal layer 10 between the upper substrate 01 and the lower substrate 02, a first polarizer 21 at a side of the upper substrate 01 facing away from the liquid crystal layer 10, a second polarizer 22 at a side of the lower substrate 02 facing away from the liquid crystal layer 10, a common electrode layer 30 at a side of the upper substrate 01 facing to the liquid crystal layer 10, and first transparent electrodes 41 and second transparent electrodes 42 at a side of the lower substrate 02 facing to the liquid crystal layer 10. The first transparent electrodes 41 and the second transparent electrodes 42 are arranged crosswise in a same layer, and a polarization direction of the first polarizer 21 and a polarization direction of the second polarizer 22 are perpendicular or parallel to each other.

For the active barrier device as shown in FIG. 1a, the liquid crystal is not deflected and the light passing through the liquid crystal will rotate by 90° (for example, vertical polarized light changes into horizontal polarized light after passing through the liquid crystal) when a voltage difference between the first transparent electrodes 41 and the common electrode layer 30 is lower than a liquid crystal deflection threshold voltage. The deflection angle of the liquid crystal is within an range from 0° to 90° and the light passing through the liquid crystal can be divided into horizontal polarized light and vertical polarized light when the voltage difference between the first transparent electrodes 41 and the common electrode layer 30 is not lower than the liquid crystal deflection threshold voltage and lower than a liquid crystal deflection saturation voltage. The liquid crystal is deflected by 90° and has no effect on the light when the voltage difference between the first transparent electrodes 41 and the common electrode layer 30 is not lower than the liquid crystal deflection saturation voltage. In addition, an implementation of the second transparent electrodes 42 is similar with the implementation of the first transparent electrodes 41.

A process of switching between a 2D display state and a 3D display state of the active barrier device as shown in FIG. 1a will be described below by taking that the polarization direction of the first polarizer 21 and the polarization direction of the second polarizer 22 are perpendicular to each other as an example (for example, the first polarizer 21 is a horizontal polarizer and the second polarizer 22 is a vertical polarizer). As shown in FIG. 1a, when both the voltage difference between the first transparent electrodes 41 and the common electrode layer 30 and the voltage difference between the second transparent electrodes 42 and the common electrode layer 30 are lower than the liquid crystal deflection threshold voltage, light emitted from a backlight source changes into vertical polarized light after passing through the second polarizer 22, the vertical polarized light changes into horizontal polarized light after passing through the liquid crystal layer 10, which horizontal polarized light can pass completely through the first polarizer 21, and thus a transmittance ratio of the active barrier device is evenly kept at a relatively high state in this situation, which corresponds to the 2D display state in a stereoscopic display. As shown in FIG. 1b, when the voltage difference between the first transparent electrodes 41 and the common electrode layer 30 is not lower than the liquid crystal deflection saturation voltage and the voltage difference between the second transparent electrodes 42 and the common electrode layer 30 is lower than the liquid crystal deflection threshold voltage, the vertical polarized light passing through the second polarizer 22 is still the vertical polarized light after passing through the liquid crystal between the first transparent electrodes 41 and the common electrode layer 30, which vertical polarized light cannot pass through the first polarizer 21, while the vertical polarized light passing through the second polarizer 22 changes into the horizontal polarized light after passing through the liquid crystal between the second transparent electrodes 42 and the common electrode layer 30, and the horizontal polarized light can pass completely through the first polarizer 21, and thus in this situation, the transmittance ratio of the active barrier device presents a barrier state with high transmittance ratio and low transmittance ratio alternated, which corresponds to the 3D display state in the stereoscopic display.

Figure 2:
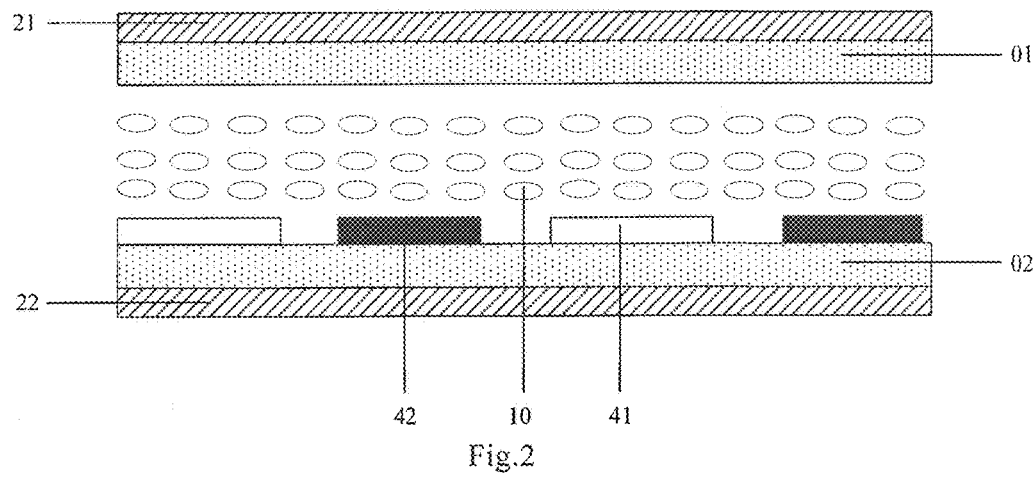
FIG. 2 is a schematic diagram of a structure of a typical active barrier device without a common electrode layer.

Of course, at present, the active barrier device can also have structures other than the structure as shown in FIG. 1a, for example, the active barrier device does not include the common electrode layer. FIG. 2 is a schematic diagram of a structure of a typical active barrier device without a common electrode layer. As shown in FIG. 2, since a small amount of charges may be accumulated at the side of the upper substrate 01 facing to the liquid crystal layer 10 in this situation, it can be considered that there are still a layer of electrodes between the upper substrate 01 and the liquid crystal layer 10 and a voltage value about 0V is applied on the layer of electrodes. A voltage difference may be formed between the first transparent electrodes 41 and the layer of electrodes and a voltage difference may be formed between the second transparent electrodes 42 and the layer of electrodes, such that deflection degree of the liquid crystal in the liquid crystal layer 10 can be controlled.

Figure 3:
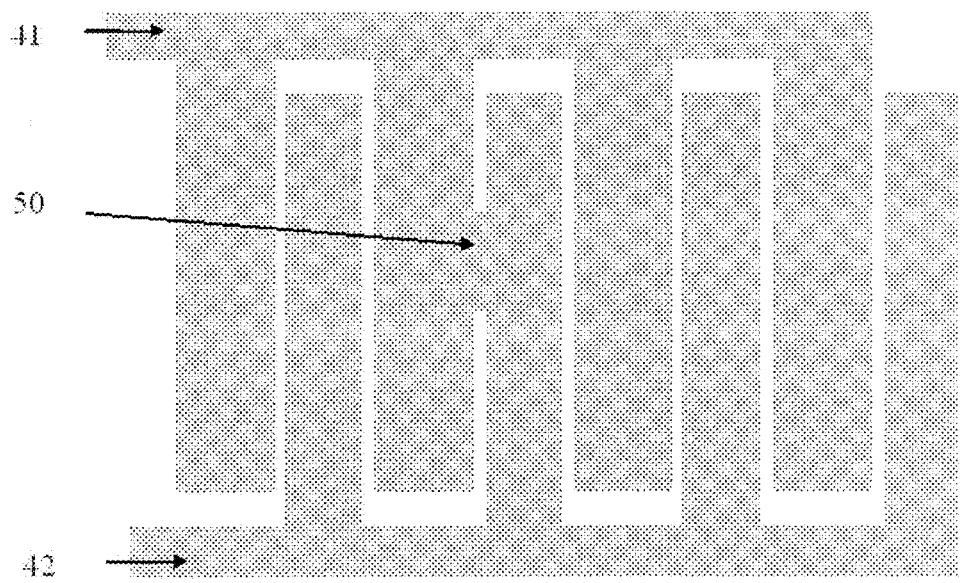
FIG. 3 is a schematic diagram of a structure of a typical short-circuit point.
Figure 4:
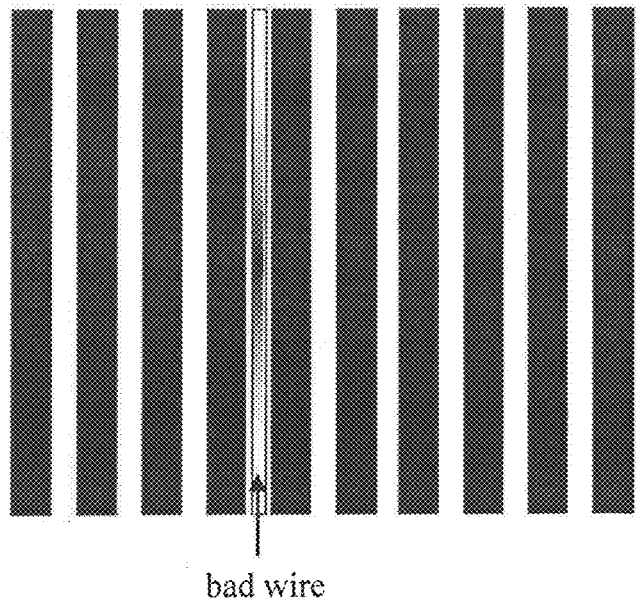
FIG. 4 is a schematic diagram of a typical bad wire caused by a short-circuit point.

FIG. 3 is a schematic diagram of a structure of a typical short-circuit point. At present, for the active barrier device as shown in FIG. 1a or FIG. 2, since the luminance variation in a gap area between the first transparent electrodes 41 and the second transparent electrodes 42 cannot be controlled, the gap area between the first transparent electrodes 41 and the second transparent electrodes 42 will be manufactured to be relatively narrow as shown in FIG. 3, such that a short-circuit point 50 which is in contact with the first transparent electrodes 41 and the second transparent electrodes 42 simultaneously may be generated easily due to reasons such as incomplete etching in the gap area or conductive impurity falling into the gap area. FIG. 4 is a schematic diagram of a typical bad wire caused by a short-circuit point. Due to existence of the short-circuit point, when the active barrier device is controlled to present the 3D display state, the display luminance of the second transparent electrodes which is in contact with the short-circuit point and should display a bright state will present a gradual change state, as shown in FIG. 4, and thus the display effect is affected seriously.

The specific implementation of the embodiments of the present disclosure will be described below in detail with reference to the accompanying drawings.

It should be explained that the raster device in the embodiments of the present disclosure can comprise a common electrode layer, and can also not comprise a common electrode layer. When the raster device comprises a common electrode layer, in order to determine the location of the short-circuit point in the raster device, the common electrode layer can be powered or not be powered.

The solutions in the embodiments of the present disclosure will be described below in detail by taking whether the raster device comprises a common electrode layer and whether the common electrode layer is powered as the basis for classification.

According to a case in the embodiments of the present disclosure, the raster device comprises a common electrode layer and the common electrode layer is powered.

Figure 5:
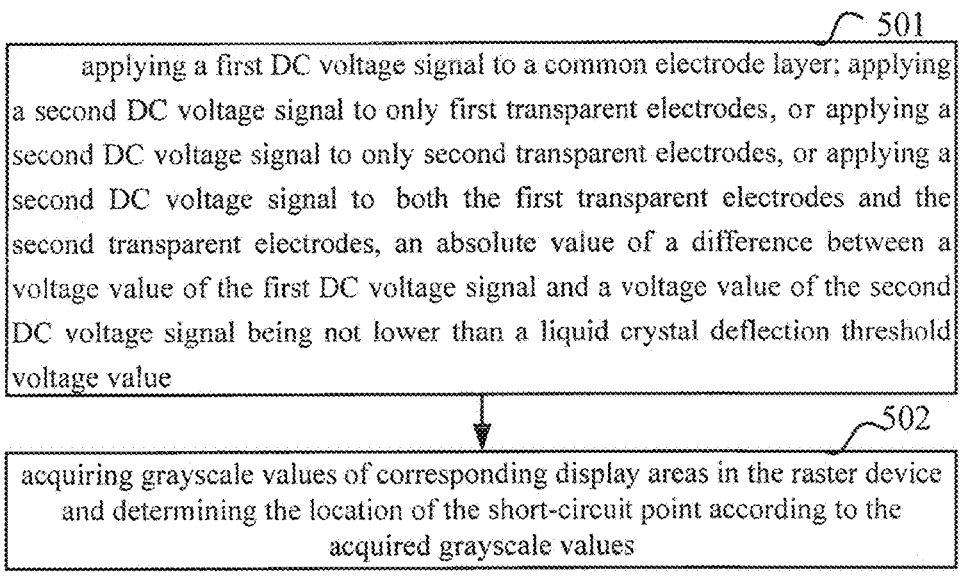
FIG. 5 is a schematic flowchart of a first method for determining location of a short-circuit point in a raster device in an embodiment of the present disclosure.

FIG. 5 is a schematic flowchart of a first method for determining location of a short-circuit point in a raster device in an embodiment of the present disclosure. As shown in FIG. 5, the method comprises the following steps.

At step 501, a first DC voltage signal is applied to a common electrode layer in the raster device; and a second DC voltage signal is applied to only first transparent electrodes in the raster device, or a second DC voltage signal is applied to only second transparent electrodes in the raster device, or a second DC voltage signal is applied to both the first transparent electrodes and the second transparent electrodes in the raster device. Here, an absolute value of a difference between a voltage value of the first DC voltage signal and a voltage value of the second DC voltage signal is not lower than a liquid crystal deflection threshold voltage value.

At step 502, grayscale values of corresponding display areas in the raster device are acquired, and the location of the short-circuit point is determined according to the acquired grayscale values.

In implementations, the first transparent electrodes and the second transparent electrodes may be powered in the following manners: the second DC voltage signal is applied to only the first transparent electrodes, or the second DC voltage signal is applied to only the second transparent electrodes, or the second DC voltage signal is applied to both the first transparent electrodes and the second transparent electrodes.

When the first transparent electrodes and the second transparent electrodes are powered in any one of the above manners, it is possible for the first transparent electrodes, the second transparent electrodes and the short-circuit point to have a same DC voltage signal, that is, the second DC voltage signal, under the effect of the short-circuit point.

In addition, the common electrode layer may be powered in a manner that the first DC voltage signal is applied to the common electrode layer. Here, the absolute value of the difference between the voltage value of the first DC voltage signal and the voltage value of the second DC voltage signal is not lower than the liquid crystal deflection threshold voltage value.

Therefore, it is possible that the first transparent electrodes, the second transparent electrodes and the area where the short-circuit point in a gap area between the first transparent electrode and the second transparent electrode is located have a same first display grayscale, and the areas which are not covered by the short-circuit point in the gap area have a second display grayscale. That is, the display grayscale of the area where the short-circuit point in the gap area between the first transparent electrode and the second transparent electrode is located is different from the display grayscale of other areas in the gap area. Therefore, after the grayscale values of the corresponding display areas in the raster device are acquired, the location of the short-circuit point can be easily determined according to the acquired grayscale values.

In implementations, the signals applied to the common electrode layer, the first transparent electrodes and the second transparent electrodes are DC signals, it can be avoided that the display grayscale of the areas where the short-circuit point, the first transparent electrode and the second transparent electrode are located is the same as the display grayscale of the areas not covered by the short-circuit point in the gap area, thus improving accuracy of the determined location of the short-circuit point.

Optionally, at the step 501, the voltage value of the first DC voltage signal is higher than the voltage value of the second DC voltage signal, or the voltage value of the first DC voltage signal is lower than the voltage value of the second DC voltage signal.

Optionally, at the step 501, the absolute value of the difference between the voltage value of the first DC voltage signal and the voltage value of the second DC voltage signal is lower than the liquid crystal deflection saturation voltage value, or the absolute value of the difference between the voltage value of the first DC voltage signal and the voltage value of the second DC voltage signal is not lower than the liquid crystal deflection saturation voltage value.

In implementations, when the polarization direction of a first polarizer and the polarization direction of a second polarizer in the raster device are perpendicular to each other, the areas not covered by the short-circuit point in the gap area between the first transparent electrode and the second transparent electrode display white. If the absolute value of the difference between the voltage value of the first DC voltage signal and the voltage value of the second DC voltage signal is lower than the liquid crystal deflection saturation voltage value, the areas where the first transparent electrodes, the second transparent electrodes and the short-circuit point are located display grey. If the absolute value of the difference between the voltage value of the first DC voltage signal and the voltage value of the second DC voltage signal is not lower than the liquid crystal deflection saturation voltage value, the areas where the first transparent electrodes, the second transparent electrodes and the short-circuit point are located display black.

When the polarization direction of the first polarizer and the polarization direction of the second polarizer in the raster device are parallel to each other, the areas not covered by the short-circuit point in the gap area between the first transparent electrode and the second transparent electrode display black. If the absolute value of the difference between the voltage value of the first DC voltage signal and the voltage value of the second DC voltage signal is lower than the liquid crystal deflection saturation voltage value, the areas where the first transparent electrodes, the second transparent electrodes and the short-circuit point are located display grey. If the absolute value of the difference between the voltage value of the first DC voltage signal and the voltage value of the second DC voltage signal is not lower than the liquid crystal deflection saturation voltage value, the areas where the first transparent electrodes, the second transparent electrodes and the short-circuit point are located display white.

Therefore, when the absolute value of the difference between the voltage value of the first DC voltage signal and the voltage value of the second DC voltage signal is not lower than the liquid crystal deflection saturation voltage value, the contrast between the display grayscale of the area where the short-circuit point in the gap area between the first transparent electrode and the second transparent electrode is located and the display grayscale of other areas in the gap area is relatively high, such that the short-circuit point can be identified easily, thus improving the accuracy of the determined location of the short-circuit point.

Figure 6:
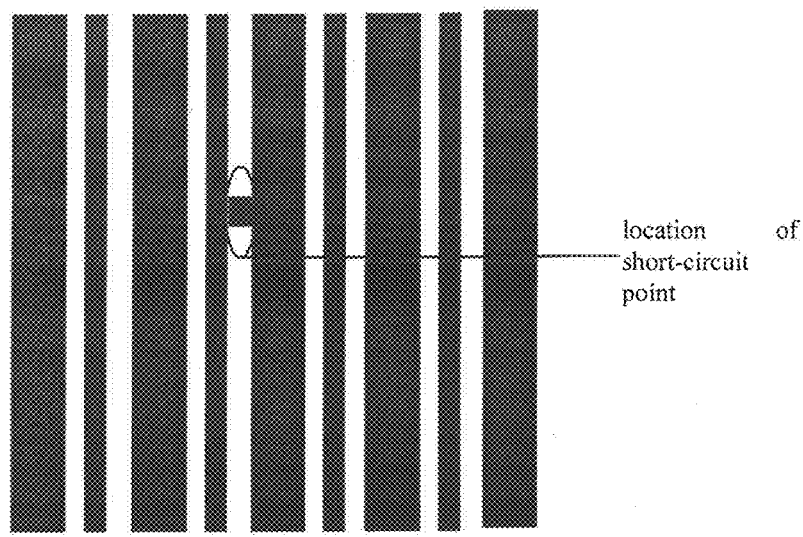
FIG. 6 is a schematic diagram of the grayscale in corresponding display areas in a raster device in an embodiment of the present disclosure.

FIG. 6 is a schematic diagram of the grayscale in corresponding display areas in a raster device in an embodiment of the present disclosure. For example, when the polarization direction of the first polarizer and the polarization direction of the second polarizer in the raster device are perpendicular to each other, and the absolute value of the difference between the voltage value of the first DC voltage signal and the voltage value of the second DC voltage signal is not lower than the liquid crystal deflection saturation voltage value, the grayscale values of the corresponding display areas in the raster device are as shown in FIG. 6. The areas not covered by the short-circuit point in the gap area between the first transparent electrode and the second transparent electrode display white, and the areas where the first transparent electrodes, the second transparent electrodes and the short-circuit point are located display black, thus the location of the black short-circuit point in the gap area between the first transparent electrode and the second transparent electrode can be determined easily.

Optionally, at the step 501, a difference between the absolute value of the difference between the voltage value of the first DC voltage signal and the voltage value of the second DC voltage signal and the liquid crystal deflection threshold voltage value is lower than a set threshold, such that the liquid crystal in the areas not covered by the short-circuit point in the gap area between the first transparent electrode and the second transparent electrode in the raster device does not deflect.

Figure 7:
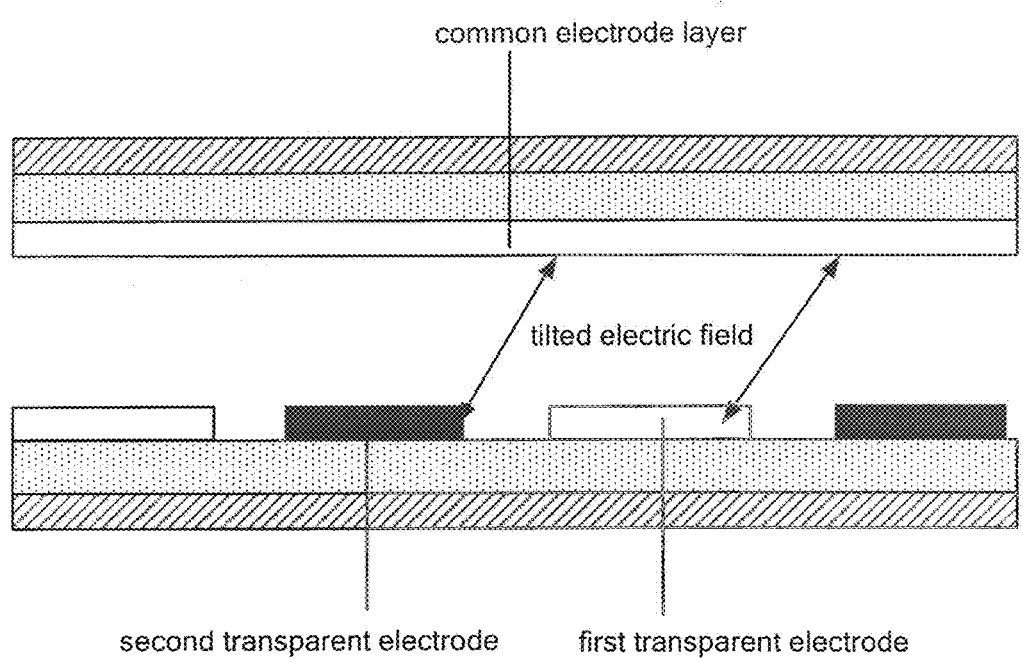
FIG. 7 is a schematic diagram of a structure of a tilted electric field formed between first transparent electrodes (and/or second transparent electrodes) and a common electrode layer in an embodiment of the present disclosure.

FIG. 7 is a schematic diagram of a structure of a tilted electric field formed between the first transparent electrodes (and/or the second transparent electrodes) and the common electrode layer in an embodiment of the present disclosure. In implementations, as shown in FIG. 7, a tilted electric field is formed between the first transparent electrodes and the common electrode layer and between the second transparent electrodes and the common electrode layer, when the difference between the absolute value of the difference between the voltage value of the first DC voltage signal and the voltage value of the second DC voltage signal and the liquid crystal deflection threshold voltage value is not lower than the set threshold, the liquid crystal in the areas not covered by the short-circuit point in the gap area will deflect under the effect of the tilted electric field.

In the embodiments of the present disclosure, the difference between the absolute value of the difference between the voltage value of the first DC voltage signal and the voltage value of the second DC voltage signal and the liquid crystal deflection threshold voltage value is lower than the set threshold, it can be ensured that the liquid crystal in the areas not covered by the short-circuit point in the gap area does not deflect, such that the areas which have a display grayscale value different from the display grayscale value of the area where short-circuit point is located can be wider, which is convenient for identification of the short-circuit point, and thus improving the accuracy of the determined location of the short-circuit point.

Optionally, at the step 501, the voltage value of the first DC voltage signal and the voltage value of the second DC voltage signal can be set arbitrarily, only if it is satisfied that the absolute value of the difference between the voltage value of the first DC voltage signal and the voltage value of the second DC voltage signal is not lower than the liquid crystal deflection threshold voltage value.

Optionally, at the step 501, the voltage value of the first DC voltage signal is equal to 0V.

In implementations, the voltage value of the first DC voltage signal is equal to 0V, thus reducing the power consumption required for driving the raster device.

In implementations, the voltage value of the first DC voltage signal is equal to 0V, and compared to the solution where no common electrode layer is set in the raster device and the solution where the common electrode layer is not powered, the voltage applied to the common electrode layer can be controlled accurately, precision and stability of the grayscale values of the corresponding display areas in the raster device can be improved, and thus the accuracy of the determined location of the short-circuit point can be improved.

Optionally, the implementation for acquiring the grayscale values of the corresponding display areas in the raster device in the embodiments of the present disclosure is similar with the implementation for typically acquiring the grayscale values of the corresponding display areas in the raster device. For example, the grayscale values of the corresponding display areas in the raster device are acquired by photographing the display area of the raster device and then processing a photographed picture by an equipment.

Optionally, at the step 502, any implementation for determining the location of the short-circuit point according to the acquired grayscale values can be applicable to the embodiments of the present disclosure. For example, it is firstly determined how many display grayscales exist in the gap area between the first transparent electrode and the second transparent electrode, and it is then determined that the location corresponding to the display grayscale occupying a minimum area is the location of the short-circuit point.

Optionally, at the step 502, the determination of the location of the short-circuit point according to the acquired grayscale values comprises:

comparing the acquired grayscale values with a grayscale value of a standard display area and taking a coordinate location which has a grayscale value different from others as the location of the short-circuit point;

wherein the grayscale value of the standard display area is a grayscale value of the corresponding display area when there is no short-circuit point in the raster device.

In implementations, the accuracy of the determined location of the short-circuit point can be improved by defining the location of the short-circuit point by coordinates.

According to another case in the embodiments of the present disclosure, the raster device does not comprise a common electrode layer, or the raster device in the embodiments of the present disclosure comprises a common electrode layer but the common electrode layer is not powered.

Figure 8:
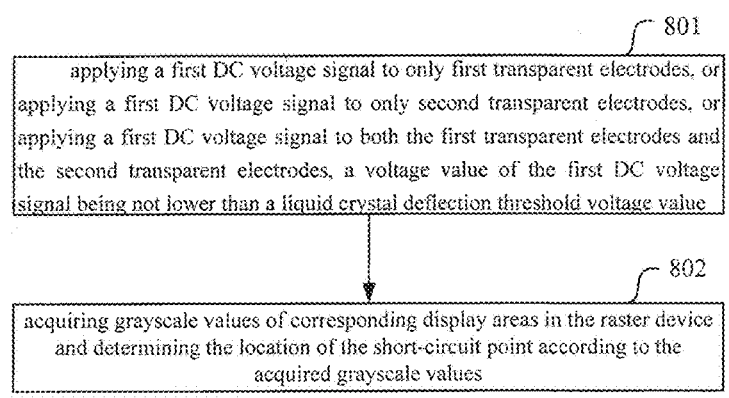
FIG. 8 is a schematic flowchart of a second method for determining location of a short-circuit point in a raster device in an embodiment of the present disclosure.

FIG. 8 is a schematic flowchart of a second method for determining location of a short-circuit point in a raster device in an embodiment of the present disclosure. As shown in FIG. 8, the method comprises the following steps.

At step 801, a first DC voltage signal is applied to only first transparent electrodes in the raster device, or a first DC voltage signal is applied to only second transparent electrodes in the raster device, or a first DC voltage signal is applied to both the first transparent electrodes and the second transparent electrodes in the raster device. Here, a voltage value of the first DC voltage signal is not lower than a liquid crystal deflection threshold voltage value.

At step 802, grayscale values of corresponding display areas in the raster device are acquired, and the location of the short-circuit point is determined according to the acquired grayscale values.

In implementations, only the first transparent electrodes and the second transparent electrodes may be powered, and the first transparent electrodes and the second transparent electrodes may be powered in the following manners: the first DC voltage signal is applied to only the first transparent electrodes, or the first DC voltage signal is applied to only the second transparent electrodes, or the first DC voltage signal is applied to both the first transparent electrodes and the second transparent electrodes.

When the first transparent electrodes and the second transparent electrodes are powered in any one of the above manners, it is possible for the first transparent electrodes, the second transparent electrodes and the short-circuit point to have a same DC voltage signal, that is, the first DC voltage signal, under the effect of the short-circuit point.

In addition, since the raster device in the embodiment of the present disclosure does not comprise a common electrode layer, or the raster device in the embodiment of the present disclosure comprises a common electrode layer and the common electrode layer is not powered, a voltage value at the side of the upper substrate facing the liquid crystal layer in the raster device is relevant to electric charges accumulated at the side of the upper substrate facing the liquid crystal layer, and typically has a value of about 0V.

Since the voltage value of the first DC voltage signal is not lower than the liquid crystal deflection threshold voltage value, it is possible for the areas where the first transparent electrodes, the second transparent electrodes and the short-circuit point in the gap area between the first transparent electrode and the second transparent electrode are located to have a same display grayscale, and the areas not covered by the short-circuit point in the gap area have another display grayscale. That is, the display grayscale of the area where the short-circuit point in the gap area between the first transparent electrode and the second transparent electrode is located is different from the display grayscale of other areas in the gap area. Therefore, after the grayscale values of the corresponding display areas in the raster device are acquired, the location of the short-circuit point can be easily determined according to the acquired grayscale values.

In implementations, the signals applied to the first transparent electrodes and the second transparent electrodes are DC signals, it can be avoided to a certain extent that the display grayscale of the areas where the first transparent electrodes, the second transparent electrodes and the short-circuit point are located is same with the display grayscale of the areas not covered by the short-circuit point in the gap area, thus improving accuracy of the determined location of the short-circuit point.

Optionally, at the step 801, the voltage value of the first DC voltage signal is lower than the liquid crystal deflection saturation voltage value, or the voltage value of the first DC voltage signal is not lower than the liquid crystal deflection saturation voltage value.

In implementations, when the polarization direction of a first polarizer and the polarization direction of a second polarizer in the raster device are perpendicular to each other, the areas not covered by the short-circuit point in the gap area between the first transparent electrode and the second transparent electrode display white. If the voltage value of the first DC voltage signal is lower than the liquid crystal deflection saturation voltage value, the areas where the first transparent electrodes, the second transparent electrodes and the short-circuit point are located display grey. If the voltage value of the first DC voltage signal is not lower than the liquid crystal deflection saturation voltage value, the areas where the first transparent electrodes, the second transparent electrodes and the short-circuit point are located display black.

When the polarization direction of the first polarizer and the polarization direction of the second polarizer in the raster device are parallel to each other, the areas not covered by the short-circuit point in the gap area between the first transparent electrode and the second transparent electrode display black. If the voltage value of the first DC voltage signal is lower than the liquid crystal deflection saturation voltage value, the areas where the first transparent electrodes, the second transparent electrodes and the short-circuit point are located display grey. If the voltage value of the first DC voltage signal is not lower than the liquid crystal deflection saturation voltage value, the areas where the first transparent electrodes, the second transparent electrodes and the short-circuit point are located display white.

Therefore, when the voltage value of the first DC voltage signal is not lower than the liquid crystal deflection saturation voltage value, the contrast between the display grayscale of the area where the short-circuit point in the gap area between the first transparent electrode and the second transparent electrode is located and the display grayscale of other areas in the gap area is relatively high, such that the short-circuit point can be identified easily, thus improving the accuracy of the determined location of the short-circuit point.

Optionally, at the step 801, a difference between the voltage value of the first DC voltage signal and the liquid crystal deflection threshold voltage value is lower than a set threshold, such that the liquid crystal in the areas not covered by the short-circuit point in the gap area between the first transparent electrode and the second transparent electrode in the raster device does not deflect.

In implementations, the difference between the voltage value of the first DC voltage signal and the liquid crystal deflection threshold voltage value is lower than the set threshold, it can be ensured that the liquid crystal in the areas not covered by the short-circuit point in the gap area does not deflect, such that the areas which have display grayscale different from the display grayscale of the area where short-circuit point is located can be wider, which is convenient for identification of the short-circuit point, and thus improving the accuracy of the determined location of the short-circuit point.

Optionally, at the step 801, the voltage value of the first DC voltage signal can be set arbitrarily as long as it is satisfied that the voltage value of the first DC voltage signal is not lower than the liquid crystal deflection threshold voltage value.

Optionally, at the step 502, the determination of the location of the short-circuit point according to the acquired grayscale values comprises:

comparing the acquired grayscale values and a grayscale value of a standard display area and taking a coordinate location which has a grayscale value different from others as the location of the short-circuit point;

wherein the grayscale value of the standard display area is a grayscale value of the corresponding display areas when there is no short-circuit point in the raster device.

According to yet another case in the embodiments of the present disclosure, the raster device comprises a common electrode layer, the common electrode layer is powered, and there are requirements on the voltage values of the DC voltage signals applied to the first transparent electrodes and the second transparent electrodes.

Optionally, in an embodiment of the present disclosure, there is provided a method for determining location of a short-circuit point in a raster device. The method comprises:

applying a first DC voltage signal to only first transparent electrodes in the raster device, or applying a first DC voltage signal to only second transparent electrodes in the raster device, or applying a first DC voltage signal to both the first transparent electrodes and the second transparent electrodes in the raster device, a voltage value of the first DC voltage signal being not lower than a liquid crystal deflection threshold voltage value; and acquiring grayscale values of corresponding display areas in the raster device and determining the location of the short-circuit point according to the acquired grayscale values.

Optionally, before acquiring the grayscale values of the corresponding display areas in the raster device, the method further comprises:

applying a second DC voltage signal to a common electrode layer in the raster device; wherein an absolute value of a difference between a voltage value of the second DC voltage signal and the voltage value of the first DC voltage signal is not lower than the liquid crystal deflection threshold voltage value.

It should be explained that in the embodiments of the present disclosure, the voltage value of the first DC voltage signal is not lower than the liquid crystal deflection threshold voltage value, and the absolute value of the difference between the voltage value of the second DC voltage signal and the voltage value of the first DC voltage signal is not lower than the liquid crystal deflection threshold voltage value.

Optionally, the voltage value of the first DC voltage signal is higher than the voltage value of the second DC voltage signal, or the voltage value of the first DC voltage signal is lower than the voltage value of the second DC voltage signal.

In implementations, the voltage value of the first DC voltage signal is higher than the voltage value of the second DC voltage signal, thus reducing the power consumption required for driving the raster device.

Optionally, the absolute value of the difference between the voltage value of the second DC voltage signal and the voltage value of the first DC voltage signal is lower than the liquid crystal deflection saturation voltage value, or the absolute value of the difference between the voltage value of the second DC voltage signal and the voltage value of the first DC voltage signal is not lower than the liquid crystal deflection saturation voltage value.

In implementations, the absolute value of the difference between the voltage value of the second DC voltage signal and the voltage value of the first DC voltage signal is not lower than the liquid crystal deflection saturation voltage value, the contrast between the display grayscale of the area where the short-circuit point in the gap area between the first transparent electrode and the second transparent electrode is located and the display grayscale of other areas in the gap area can be improved, such that the short-circuit point can be identified easily, thus improving the accuracy of the determined location of the short-circuit point.

Optionally, the difference between the absolute value of the difference between the voltage value of the second DC voltage signal and the voltage value of the first DC voltage signal and the liquid crystal deflection threshold voltage value is lower than a set threshold, such that the liquid crystal in the areas not covered by the short-circuit point in the gap area between the first transparent electrode and the second transparent electrode in the raster device does not deflect.

In implementations, the areas which has a display grayscale value different from the display grayscale value of the area where the short-circuit point is located can be wider, which is convenient for identification of the short-circuit point, and thus improving the accuracy of the determined location of the short-circuit point.

Optionally, the voltage values of the first DC voltage signal and the second DC voltage signal can be set arbitrarily as long as it is satisfied that the voltage value of the first DC voltage signal is not lower than the liquid crystal deflection threshold voltage value and the absolute value of the difference between the voltage value of the second DC voltage signal and the voltage value of the first DC voltage signal is not lower than the liquid crystal deflection threshold voltage value.

Optionally, the voltage value of the second DC voltage signal is equal to 0V.

In implementations, the power consumption required for driving the raster device can be reduced.

In implementations, compared to the solution where no common electrode layer is set in the raster device and the solution where the common electrode layer is not powered, the voltage applied to the common electrode layer can be controlled accurately, precision and stability of the grayscale values of the corresponding display areas in the raster device can be improved, and thus the accuracy of the determined location of the short-circuit point can be improved.

Optionally, the implementation for determining the location of the short-circuit point according to the acquired grayscale values in the present embodiment of the present disclosure is similar with the implementation for the step 502, and repeated descriptions are omitted herein.

Although the embodiments of the present disclosure have been described, those skilled in the art can make additional alternations and modifications upon acquiring the basic creative concept. Therefore, the accompanying claims are intended to be interpreted to encompass the above described embodiments and all alternations and modifications falling into the scope of the present disclosure.

It will be obvious that those skilled in the art may make modifications and variations to the embodiments of the present disclosure without departing from the spirit and scope of the present disclosure. Such modifications and variations are intended to be included within the scope of the present disclosure provided that the modifications and variations belong to the scope of the claims of the present disclosure and the equivalents thereof.

The present application claims the priority to a Chinese patent application No. 201410449167.6 filed on Sep. 4, 2014, the content thereof is incorporated herein by reference in its entirety as a part of the present application.

What is claimed is:

1. A method for determining location of a short-circuit point in a gap area between a first transparent electrode and a second transparent electrode in a raster device, comprising:

applying a first DC voltage signal to a common electrode layer in the raster device;

applying a second DC voltage signal to only first transparent electrodes in the raster device, or applying a second DC voltage signal to only second transparent electrodes in the raster device, or applying a second DC voltage signal to both the first transparent electrodes and the second transparent electrodes in the raster device; and acquiring grayscale values of corresponding display areas in the raster device and determining the location of the short-circuit point according to the acquired grayscale values;

wherein an absolute value of a difference between a voltage value of the first DC voltage signal and a voltage value of the second DC voltage signal being not lower than a liquid crystal deflection threshold voltage value.

2. The method of claim 1, wherein a difference between the absolute value of the difference between the voltage value of the first DC voltage signal and the voltage value of the second DC voltage signal and the liquid crystal deflection threshold voltage value is lower than a set threshold.

3. The method of claim 1, wherein the absolute value of the difference between the voltage value of the first DC voltage signal and the voltage value of the second DC voltage signal is not lower than the liquid crystal deflection saturation voltage value.

4. The method of claim 1, wherein the voltage value of the first DC voltage signal is equal to 0V.

5. The method of claim 1, wherein said determining the location of the short-circuit point according to the acquired grayscale values comprises:

comparing the acquired grayscale values and a grayscale value of a standard display area and taking a coordinate location which has a grayscale value different from others as the location of the short-circuit point;

wherein the grayscale value of the standard display area is a grayscale value of the corresponding display areas when there is no short-circuit point in the raster device.

6. A method for determining location of a short-circuit point in a gap area between a first transparent electrode and a second transparent electrode in a raster device, comprising:

applying a first DC voltage signal to only first transparent electrodes in the raster device, or applying a first DC voltage signal to only second transparent electrodes in the raster device, or applying a first DC voltage signal to both the first transparent electrodes and the second transparent electrodes in the raster device; and acquiring grayscale values of corresponding display areas in the raster device and determining the location of the short-circuit point according to the acquired grayscale values;

wherein a voltage value of the first DC voltage signal being not lower than a liquid crystal deflection threshold voltage value.

7. The method of claim 6, before acquiring the grayscale values of the corresponding display areas in the raster device, further comprising:

applying a second DC voltage signal to a common electrode layer in the raster device, wherein an absolute value of a difference between a voltage value of the second DC voltage signal and the voltage value of the first DC voltage signal is not lower than the liquid crystal deflection threshold voltage value.

8. The method of claim 7, wherein a difference between the absolute value of the difference between the voltage value of the second DC voltage signal and the voltage value of the first DC voltage signal and the liquid crystal deflection threshold voltage value is lower than a set threshold.

9. The method of claim 7, wherein the absolute value of the difference between the voltage value of the second DC voltage signal and the voltage value of the first DC voltage signal is not lower than a liquid crystal deflection saturation voltage value.

10. The method of claim 7, wherein the voltage value of the second DC voltage signal is equal to 0V.

11. The method of claim 6, wherein said determining the location of the short-circuit point according to the acquired grayscale values comprises:
    comparing the acquired grayscale values and a grayscale value of a standard display area and taking a coordinate location which has a grayscale value different from others as the location of the short-circuit point;
    wherein the grayscale value of the standard display area is a grayscale value of the corresponding display areas when there is no short-circuit point in the raster device.

12. The method of claim 2, wherein the absolute value of the difference between the voltage value of the first DC voltage signal and the voltage value of the second DC voltage signal is not lower than the liquid crystal deflection saturation voltage value.

13. The method of claim 2, wherein the voltage value of the first DC voltage signal is equal to 0V.

14. The method of claim 3, wherein the voltage value of the first DC voltage signal is equal to 0V.

15. The method of claim 2, wherein said determining the location of the short-circuit point according to the acquired grayscale values comprises:
    comparing the acquired grayscale values and a grayscale value of a standard display area and taking a coordinate location which has a grayscale value different from others as the location of the short-circuit point;
    wherein the grayscale value of the standard display area is a grayscale value of the corresponding display areas when there is no short-circuit point in the raster device.

16. The method of claim 3, wherein said determining the location of the short-circuit point according to the acquired grayscale values comprises:
    comparing the acquired grayscale values and a grayscale value of a standard display area and taking a coordinate location which has a grayscale value different from others as the location of the short-circuit point;
    wherein the grayscale value of the standard display area is a grayscale value of the corresponding display areas when there is no short-circuit point in the raster device.

17. The method of claim 4, wherein said determining the location of the short-circuit point according to the acquired grayscale values comprises:
    comparing the acquired grayscale values and a grayscale value of a standard display area and taking a coordinate location which has a grayscale value different from others as the location of the short-circuit point;
    wherein the grayscale value of the standard display area is a grayscale value of the corresponding display areas when there is no short-circuit point in the raster device.

18. The method of claim 8, wherein the absolute value of the difference between the voltage value of the second DC voltage signal and the voltage value of the first DC voltage signal is not lower than a liquid crystal deflection saturation voltage value.

19. The method of claim 8, wherein the voltage value of the second DC voltage signal is equal to 0V.

20. The method of claim 9, wherein the voltage value of the second DC voltage signal is equal to 0V.

* * * * *